United States Patent
Yanagisawa

(10) Patent No.: US 6,432,824 B2
(45) Date of Patent: Aug. 13, 2002

(54) METHOD FOR MANUFACTURING A SEMICONDUCTOR WAFER

(75) Inventor: Michihiko Yanagisawa, Sagamihara (JP)

(73) Assignee: Speedfam Co., Ltd., Ayase (JP)

( * ) Notice: Subject to any disclaimer, the term of this patent is extended or adjusted under 35 U.S.C. 154(b) by 34 days.

(21) Appl. No.: 09/785,425

(22) Filed: Feb. 20, 2001

(30) Foreign Application Priority Data

Feb. 25, 2000 (JP) ........................................ 2000-050253

(51) Int. Cl.⁷ ............................................ H01L 21/302
(52) U.S. Cl. ....................... 438/691; 438/706; 438/715; 438/974
(58) Field of Search ................................. 438/691, 692, 438/693, 706, 715, 974; 216/58, 67, 79

(56) References Cited

U.S. PATENT DOCUMENTS

| 4,900,687 A | * | 2/1990 | Partin et al. .................. 438/48 |
| 5,284,803 A | * | 2/1994 | Haisma et al. ....... 148/DIG. 12 |
| 5,980,769 A | | 11/1999 | Yanagisawa et al. ......... 216/67 |
| 5,981,392 A | * | 11/1999 | Oishi ......................... 438/691 |
| 6,150,708 A | * | 11/2000 | Gardner et al. ............. 257/446 |

FOREIGN PATENT DOCUMENTS

| JP | 9-260314 | 10/1997 |
| JP | 2000-133639 | 5/2000 |

* cited by examiner

Primary Examiner—Benjamin L. Utech
Assistant Examiner—Kin-Chan Chen
(74) Attorney, Agent, or Firm—Morrison & Foerster, LLP

(57) ABSTRACT

In the semiconductor wafer manufacturing method of the present invention, a deteriorated layer on the surface of a semiconductor wafer which has been made flat by lapping or polishing is removed by the following dry etching. Plasma which contains a neutral active species is generated within a discharge tube. The neutral active species is separated from the plasma thus generated and is then conveyed to an orifice side of a nozzle portion of the discharge tube. The orifice is opposed to the wafer surface and the nozzle portion moves along the wafer surface while the neutral active species is sprayed from the nozzle orifice toward the wafer surface which is pre-heated. By such dry etching, the deteriorated layer on the wafer surface is removed without the occurrence of any etch pit.

5 Claims, 12 Drawing Sheets

METHOD FOR MANUFACTURING A SEMICONDUCTOR WAFER

This application is based on patent application No. 2000-050253 filed in Japan, the contents of which are hereby incorporated by reference.

BACKGROUND OF THE INVENTION

1. Field of the Invention

The present invention relates to a semiconductor wafer manufacturing method capable of removing a deteriorated layer formed on the surface or in the interior of a semiconductor wafer such as silicon wafer.

2. Description of the Related Arts

Generally, in this type of a semiconductor wafer manufacturing method, as shown in FIG. 12, there are adopted a slicing process 100, a planarizing process 101, and an etching process 102.

More specifically, first in the slicing process 100, an ingot of a single silicon crystal is cut in a disc shape using a cutting tool such as an edged tool or a wire saw to afford a semiconductor wafer. In this process, concaves and convexes conforming to the edge shape of the cutting tool used are formed on the wafer surface and a deteriorated layer is formed to a depth of about 25 to 50 $\mu$m from the wafer surface. For leveling the wafer surface there is performed the planarizing process 101.

The planarizing process 101 is for removing the concaves and convexes which have been formed on the wafer surface in the slicing process 100 and thereby leveling the wafer surface. In the planarizing process, the wafer surface is subjected to lapping or polishing with use of a double-side polishing machine of a mechanical structure. In this planarizing process it is possible to attain the planarization of the wafer surface, but the removal of a deteriorated layer cannot be done to a satisfactory extent and there remains a deteriorated layer of a depth of about 10 to 15 $\mu$m from the wafer surface.

The etching process 102 is conducted for the purpose of removing the remaining deteriorated layer.

Heretofore, in this type of etching process 102 there has been adopted a wet etching process such as acid etching or alkali etching.

In the acid etching process, a wafer is dipped in a mixed solution of nitric acid ($HNO_3$) and hydrogen fluoride (HF), allowing silicon (Si) of the wafer to be oxidized with nitric acid to afford silicon oxide ($SiO_2$), which is then dissolved off with hydrogen fluoride. In this process, an etching reaction is carried out at diffusion-determined speed. Therefore, for keeping the etching speed for the wafer surface as uniform as possible, the wafer is rotated in the solution or bubbling of the solution is performed.

On the other hand, in the alkali etching process, the wafer surface is etched using an alkali solution such as KOH or NaOH to remove the deteriorated layer.

For upgrading the wafer to a further extent there sometimes is adopted a polishing process 103, as shown in FIG. 12.

The polishing process 103 is for mirror-polishing the wafer surface. In this process, mirror-like polishing is performed in plural stages, including first, second and finishing stages, to improve the flatness of the wafer surface and enhance the removing efficiency for ripple, haze and roughness component called microroughness.

In the above conventional semiconductor wafer manufacturing method, however, since there is adopted a wet etching process, there is the problem that the wafer flatness is impeded, although the deteriorated layer can be removed.

More particularly, in the acid etching process, as noted above, since the etching reaction is carried out at diffusion-determined speed, the wafer is rotated in the etching solution or bubbling of the solution is performed to keep the etching speed for the wafer surface as uniform as possible. But even by such means it is still impossible to keep the etching speed uniform to a satisfactory extent. For ensuring uniform etching it is necessary to precisely control the concentration and flow velocity of the acid etching solution used. However, it is actually difficult to make the concentration and flow velocity of the solution at the central and nearly portions of the wafer equal substantially completely to the concentration and flow velocity of the solution at the outer peripheral and nearby portions of the wafer. Consequently, the etching speed differs to an unignorable extent between the central portion and the outer peripheral portion of the wafer, thus impeding the flatness of the wafer surface.

That the dilution effect of the solution based on the formation of a reaction product in acid etching differs at various positions of the wafer also impedes the attainment of uniform etching. This tendency becomes more and more conspicuous as the wafer diameter increases. This point is a great negative factor in improving the flatness of a wafer 300 mm in diameter.

Further, the mixed solution of nitric acid and hydrogen fluoride is very unstable chemically and the storage thereof is very difficult.

In the alkali etching process, unlike the acid etching process, such a non-uniform etching caused by a bias in both solution concentration and flow velocity as in the acid etching does not occur, but there is the problem that so-called etch pits are formed on the wafer surface.

More particularly, when such a caustic alkali as KOH or NaOH etches the wafer surface in the wafer thickness direction, the etching speed differs, depending on the crystal orientation of silicon, that is, the caustic alkali exhibits anisotropy in a certain crystal orientation, with the result that etch pits are formed on the wafer surface after etching.

Besides, the tendency toward a larger wafer diameter is giving rise to a correspondingly increased consumption of both acid and alkali solutions, thus inevitably requiring an increase of equipment for treating the resulting waste fluids.

Further, with the recent demand for upgrading the wafer, restrictions against impurities, e.g., metal contamination, are also becoming more and more strict, and additional costs are now required for improving the purity of the etching solution to be used and for the maintenance and storage thereof.

The present invention has been accomplished for solving the above-mentioned problems and it is an object of the invention to provide a method for manufacturing a semiconductor wafer of high quality which method adopts a novel dry etching process and thereby can remove a deteriorated layer, ensure flatness and prevent the occurrence of etch pits.

SUMMARY OF THE INVENTION

The semiconductor wafer manufacturing method of the present invention comprises a slicing process for slicing an ingot of a single silicon crystal to afford a wafer for semiconductors, a planarizing process for lapping or polishing a surface of the wafer obtained in the slicing process to flatten the wafer surface, and a dry etching process for removing a deteriorated layer from the wafer by spraying a neutral active species locally to the surface of the wafer obtained in the planarizing process. The dry etching process comprises a plasma generating step by allowing a halogen-containing compound gas contained in a discharge tube to be discharged to generate plasma containing a neutral active species, an active species conveying step for separating the neutral active species from the plasma by conveying the plasma gas to an orifice side of a nozzle portion of the discharge tube, and spraying the neutral active species locally to the wafer surface opposed to the nozzle orifice, and a deteriorated layer removing step for moving the nozzle portion of the discharge tube relatively along the wafer surface to etch off the deteriorated layer of the wafer.

According to this construction, in the slicing process, an ingot of a single silicon crystal is sliced in the shape of a semiconductor wafer, then in the planarizing process the wafer surface is subjected to lapping or polishing and is leveled thereby.

Lastly, in the dry etching process, the deteriorated layer of the wafer is removed. To be more specific, in the dry etching process, the plasma generating step is carried out, whereby a gas of a halogen-containing compound present within a discharge tube is discharged and plasma which contains a neutral active species is generated within the discharge tube. Then, the active species conveying step is carried out, whereby the neutral active species is separated from the plasma while conveyed to the nozzle orifice side of the discharge tube and is sprayed locally to the wafer surface opposed to the nozzle orifice. Subsequently, the deteriorated-layer removing step is carried out, whereby the nozzle portion is moved relatively along the wafer surface and the deteriorated layer of the wafer is etched off.

As the gas added in the plasma generating step in the dry etching process there is used at least one of oxygen gas, hydrogen gas, and ammonia gas.

Further, between the planarizing process and the dry etching process is provided a heating process of heating the wafer having gone through the planarizing process to a temperature of above 60° C. and below 350° C.

Further, the dry etching process includes a temperature controlling step of making control so as to heat one side of the wafer to which the neutral active species is sprayed to a temperature of above 60° C. and to cool another side to a temperature not exceeding 350° C.

Further, in these semiconductor wafer manufacturing methods there is provided a polishing process for mirror-polishing the wafer surface which has been treated in the dry etching process.

According to the semiconductor wafer manufacturing method of the present invention, the neutral active species generated in the plasma generating step of the dry etching process is sprayed locally to the wafer surface from the nozzle orifice of the discharge tube in the active species conveying step, then in the deteriorated layer removing step, the nozzle portion is moved relatively along the wafer surface to etch off the deteriorated layer of the wafer, and thus the deteriorated layer can be removed while etching the wafer surface flatways. Besides, unlike the conventional acid etching technique, there does not occur the phenomenon that the dilution effect of solution caused by the creation of a reduction product differs at various positions of the wafer. Consequently, even such a large size of wafer as 300 mm in diameter can be dry-etched while retaining its flatness.

Moreover, since there is adopted the active species conveying step of conveying the neutral active species to the orifice side of the nozzle portion and spraying it locally to the wafer surface opposed to the orifice, the etching speed of the neutral active species for the wafer exhibits isotropy and is thus not influenced by the crystal orientation of the wafer. As a result, it is possible to prevent the occurrence of etch pits which has been a problem in the conventional alkali etching technique.

Further, since the gases used in the dry etching process are a halogen-containing compound gas and an additive gas such as oxygen gas, hydrogen gas, or ammonia gas, the gases can be stored safely and easily by charging them respectively into gas cylinders. Also, since the product produced in the process is gaseous, a disposal equipment of a small size and a simple structure will do. Additionally, since there is no fear of metal contamination of the wafer, it is possible to omit the management cost for the prevention of metal contamination and thus the total maintenance and management cost can be so much reduced.

Other objects and advantages besides those discussed above shall be apparent to those skilled in the art from the description of a preferred embodiment of the invention which follows. In the description, reference is made to accompanying drawings, which form a part thereof, and which illustrate an example of the invention. Such example, however, is not exhaustive of various embodiments of the invention, and therefore reference is made to the claims which follow the description for determining the scope of the invention.

BRIEF DESCRIPTION OF THE DRAWINGS

The accompanying drawings, which are incorporated in and constitute a part of the specification, illustrate embodiments of the invention and together with the description, serve to explain the principles of the invention.

DESCRIPTION OF THE PREFERRED EMBODIMENTS

Embodiments of the present invention will be described hereinunder with reference to the accompanying drawings.

(First Embodiment)

Figure 1:
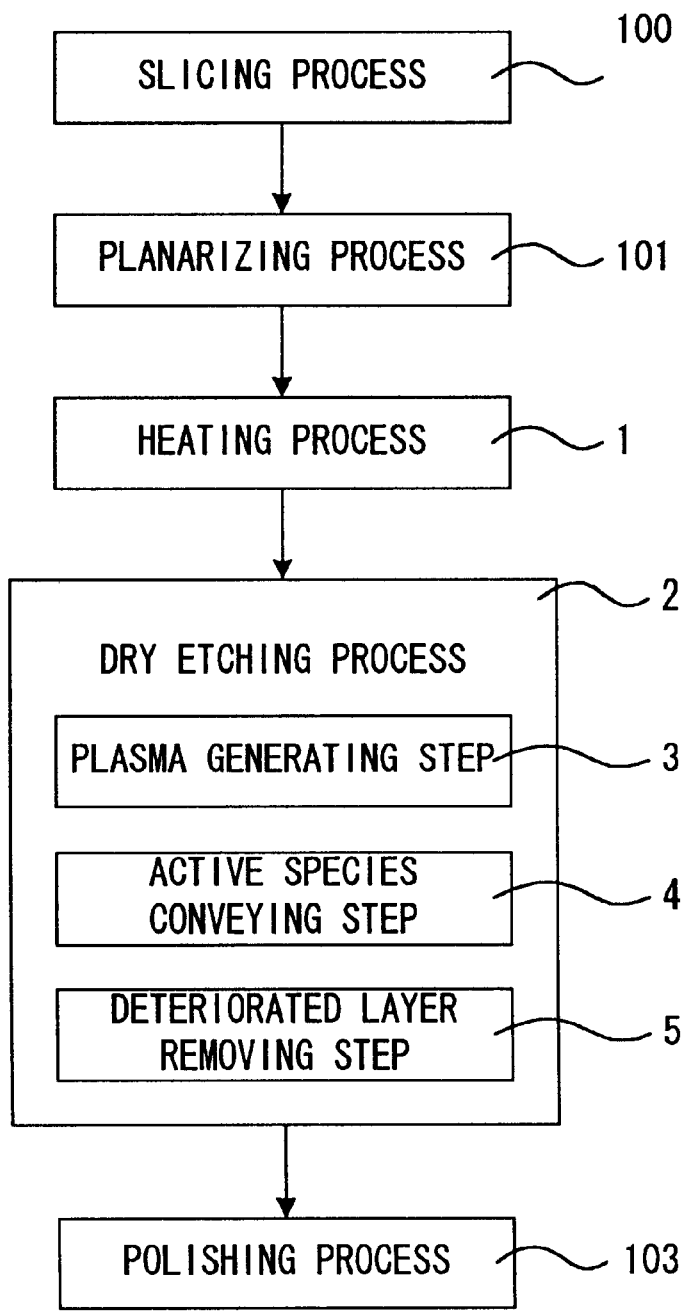
FIG. 1 is a block diagram showing a semiconductor wafer manufacturing method according to the first embodiment of the present invention.
Figure 12:
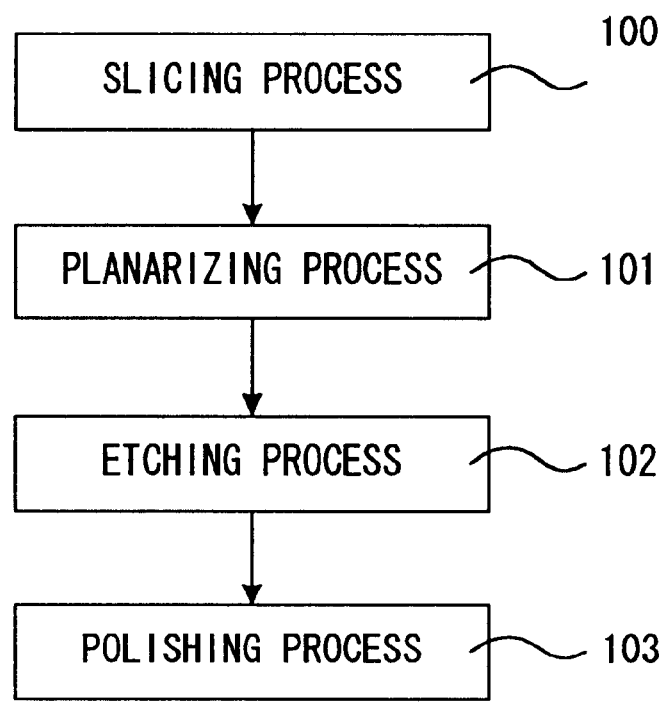
FIG. 12 is a block diagram showing a conventional semiconductor wafer manufacturing method.

FIG. 1 is a block diagram showing a semiconductor wafer manufacturing method according to the first embodiment of the present invention. Regarding the same processes as in the conventional semiconductor wafer manufacturing method illustrated in FIG. 12, they will be identified by the same reference numerals as in FIG. 12.

As shown in FIG. 1, the semiconductor wafer manufacturing method of this embodiment comprises a slicing process 100, a planarizing process 101, a heating process 1, a dry etching process 2, and a polishing process 103.

The slicing process 100, planarizing process 101 and polishing process 103 are the same as in the prior art.

That is, the slicing process 100 involves slicing an ingot of a single silicon crystal to afford a semiconductor wafer, the planarizing process 101 involves lapping or polishing a wafer surface for flattening the wafer obtained in the slicing process 100, and the polishing process 103 involves mirror-polishing the wafer surface which has been treated in the dry etching process 2.

This embodiment is the same as the prior art with respect to the slicing process 100, planarizing process 101 and polishing process 103 as mentioned above, but is different from the prior art in that the heating process 1 is provided after the planarizing process 101 and that the dry etching process 2, not the wet etching process 102, is adopted as the etching process.

Therefore, only the heating process 1 and the dry etching process 2 will be described in detail below.

As shown in FIG. 1, the heating process is provided between the planarizing process 101 and the dry etching process 2 to heat a wafer to a temperature of above 60° C. and below 350° C. The dry etching process 2 removes a deteriorated layer of the wafer while spraying a neutral active species locally to a surface of the wafer obtained in the planarizing process 101 and it carries out a plasma generating step 3, an active species conveying step 4 and a deteriorated layer removing step 5.

Figure 2:
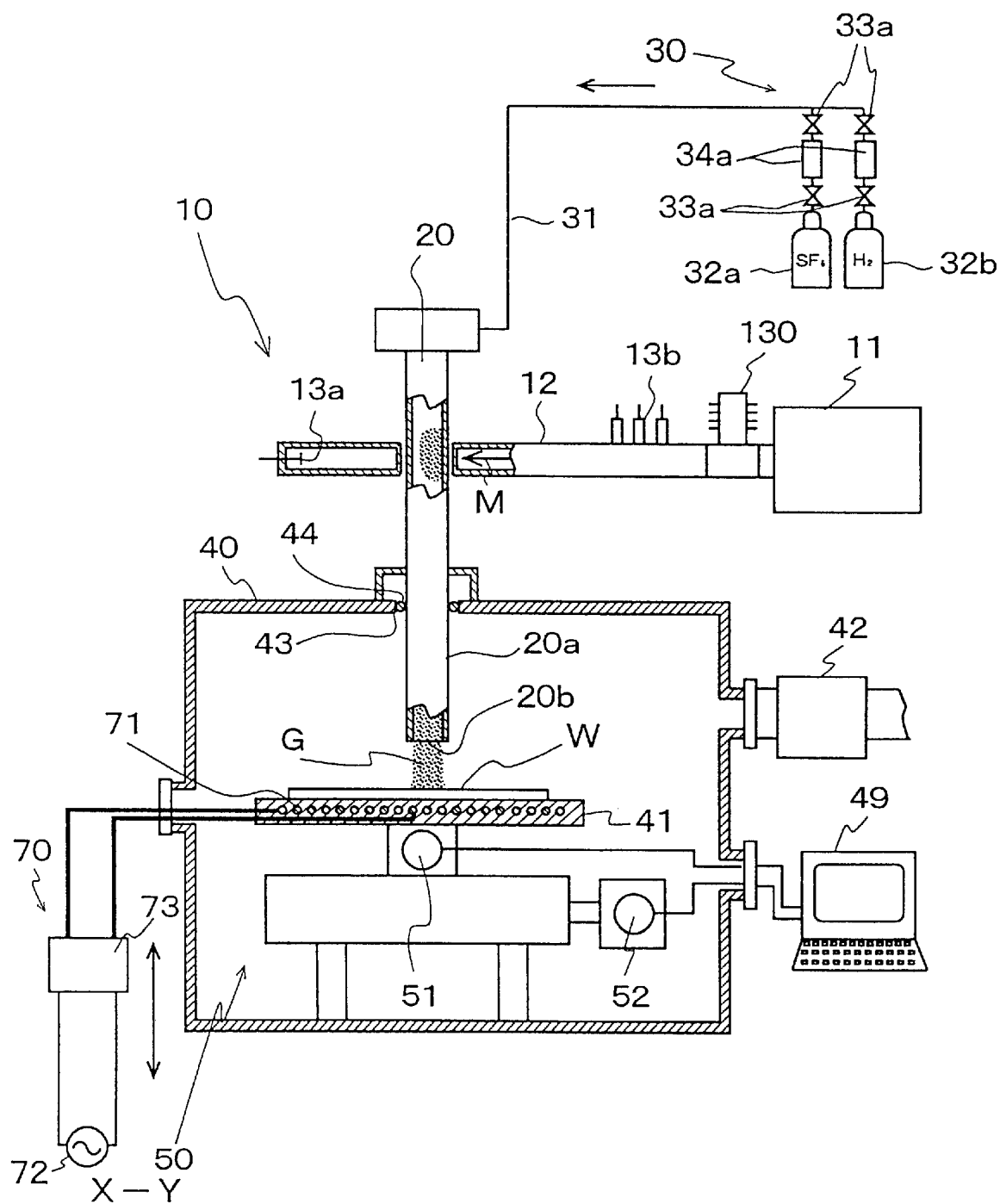
FIG. 2 is a schematic configuration diagram showing a local etching system for carrying out a heating process and a dry etching process concretely.

FIG. 2 is a schematic configuration diagram showing a local etching system for carrying out the heating process 1 and the dry etching process 2 concretely.

The local etching system is provided with a plasma generator 10, an alumina discharge tube 20, a gas supply unit 30, an X-Y drive mechanism 50, and a wafer heating unit 70.

The plasma generator 10 causes a gaseous mixture contained in the alumina discharge tube 20 to discharge to produce plasma which contains a neutral active species G.

The plasma generator 10 comprises a microwave oscillator 1 and a waveguide 12. The microwave oscillator 11 is magnetron and can generate a microwave M of a predetermined frequency. The waveguide 12 is for propagating the microwave M generated from the microwave oscillator 11 and it is fitted on the alumina discharge tube 20.

In the interior of the left end of the waveguide 12 is mounted a reflecting plate (short plunger) 13a which reflects the microwave M and forms a standing wave. Halfway of the waveguide 12 are mounted a stab tuner 13b for phasing the microwave M and an isolator 13c for bending the reflected microwave M, which is traveling toward the microwave oscillator 11, in a 90° direction (the surface direction in FIG. 2).

The alumina discharge tube 20 is a long cylinder having a nozzle portion 20a at a lower end thereof, with a feed pipe 31 of the gas supply unit 30 being connected to an upper end of the tube 20.

The gas supply unit 30 is for the supply of gases into the alumina discharge tube 20 and is provided with a cylinder 32a containing $SF_6$ (sulfur hexafluoride) and a cylinder 32b containing $H_2$ (hydrogen gas) The cylinders 32a and 32b are connected to the feed pipe 31 through valves 33a and flow rate controllers 34a.

When a wafer W is put on a chuck 41 disposed within a chamber 40, it is attracted with an electrostatic force of the chuck 41. A vacuum pump 42 is attached to the chamber 40, whereby a vacuum can be formed in the interior of the chamber 40. A hole 43 is formed centrally of an upper surface of the chamber 40 and the nozzle portion 20a of the alumina discharge tube 20 is inserted through the hole 43 into the chamber 40. An O-ring 44 is mounted between the hole 43 and the alumina discharge tube 20 to keep a clearance between the hole 43 and the alumina discharge tube 20 air-tight.

The X-Y drive mechanism 50 is disposed within the chamber 40 and bears the chuck 41 from below.

The X-Y drive mechanism 50 includes an X-drive motor 51 and a Y-drive motor 52. With the X-drive motor 51, the chuck 41 is moved right and left in FIG. 2, while with the Y-drive motor 52, the chuck 41 and the X-drive motor 51 are moved in the paper surface and back direction in FIG. 2. Thus, with the X-Y drive mechanism 50, the nozzle portion 20a can be relatively moved in X-Y directions with respect to the wafer W. The operation of the X-drive motor 51 and that of the Y-drive motor 52 in the X-Y drive mechanism 50 are controlled by a control computer 49 in accordance with a predetermined program.

The wafer heating unit 70 is a heater for heating the whole of the wafer W to a substantially uniform temperature and is provided with a heating wire 71, a power supply 72 for applying a voltage to the heating wire 71, and a voltage controller 73 for controlling the voltage to be applied to the heating wire 71.

Figure 3:
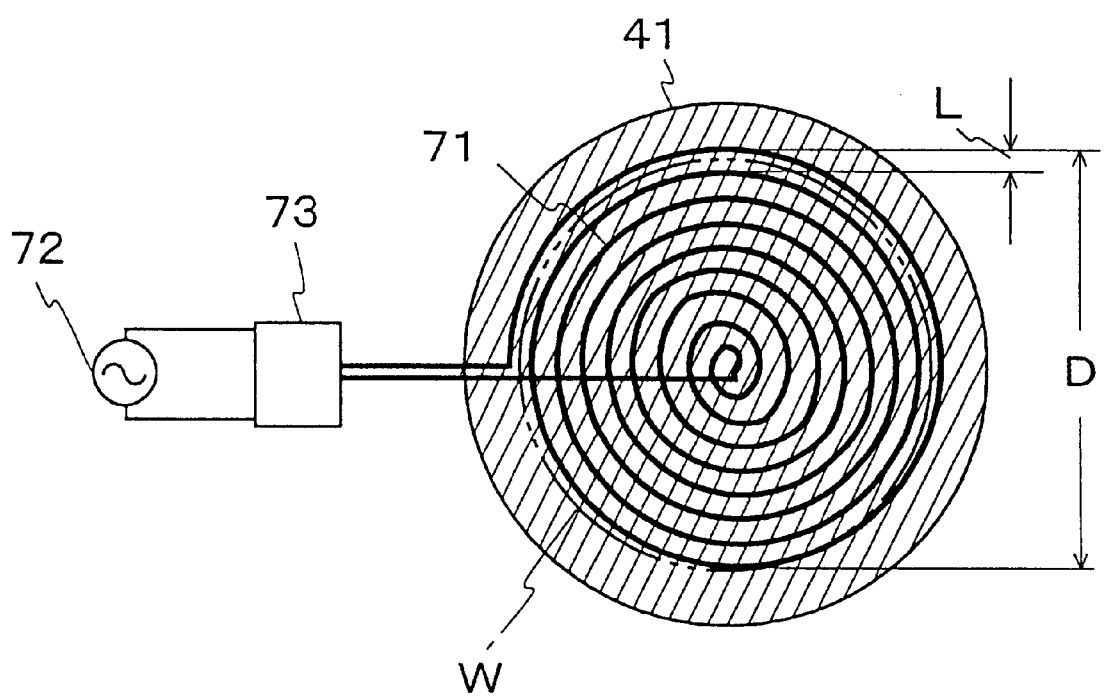
FIG. 3 is a sectional view showing in what state a heating wire is laid.

As shown in FIG. 3, the heating wire 71 is bent spirally at a predetermined line spacing L and its diameter D is set a little larger than the diameter of the wafer W (indicated with a dash-double dot line).

As shown in FIG. 2, the heating wire 71 is mounted in the interior or a lower portion of the chuck 41 in opposition to the whole of the back side of the wafer W put on the chuck 41. Thus, the heating wire 71 is disposed below the wafer W in a spiral form along the entire back side of the wafer.

Both ends of the heating wire 71 are drawn out from the chuck 41 and are electrically connected to the voltage controller 73 which is disposed outside the chamber 40. The voltage controller 73 is electrically connected to the power supply 72.

The dry etching process 2 in the local etching system constructed as above is carried out in the following manner.

First, in FIG. 1, with the wafer W chucked by the chuck 41, the vacuum pump 42 is operated to adjust the internal pressure of the chamber 40 into a low atmospheric pressure level of about 100 Pa.

Then, the heating process 1 is carried out. More specifically, the power supply 72 in the wafer heating unit 70 is turned ON, the voltage to be applied to the heating wire 71 is controlled by the voltage controller 73, and the temperature of the heating wire 71 is raised to a level in the range from above 60° C. and below 350° C. to heat the whole of the wafer W on the chuck 41 uniformly.

In this state the dry etching process 2 is carried out. In the dry etching process 2, first the plasma generating step 3 is carried out, in which step 3 a gaseous mixture contained in the alumina discharge tube 20 is allowed to discharge, thereby generating plasma which contains the neutral active species G.

To be more specific, the valves 33a in the gas supply unit 30 are opened, allowing SFc gas contained in the cylinder 32a and H₂ gas contained in the cylinder 32b to flow out through the feed pipe 31 into the alumina discharge tube 20. At this time, the pressure of SFc gas and that of H₂ gas are maintained at a predetermined value by adjusting the degree of opening of the valves 33a and the flow rate of the gaseous mixture is adjusted to 800 SCCM by the flow rate controllers 34a.

Simultaneously with the above gaseous mixture supplying work, the microwave oscillator 11 is operated to output a microwave M with a power of 1 kW and a frequency of 2.45 GHz. As a result, the $SF_6$ gas is discharged by the microwave M and generates plasma which contains a neutral active species G such as F (fluorine) atom.

Then, the active species conveying step 4 is carried out. In this step, gases resulting from the discharge are conveyed through the long alumina discharge tube 20 to an orifice 20b side of the nozzle portion 20a and are sprayed to the surface of the wafer W spaced away from the discharge site. At this time, charged particles such as electrons and ions contained in the gases in transit impinge frequently upon the inner wall of the alumina discharge tube 20 and other particles and vanish prior to being jetted from the orifice 20b. As a result, only the neutral active species G of the neutral F radical, which is difficult to vanish on impingement and which has a long life, is jetted to the surface of the wafer W. Thus, the neutral active species G contained in the plasma is jetted as if it were separated from the plasma onto the surface of the wafer W.

In this state the deteriorated layer removing step 5 is carried out. In the deteriorated layer removing step 5, the nozzle portion 20a is moved relatively along the surface of the wafer W to etch off a deteriorated layer from the wafer.

Figure 4:
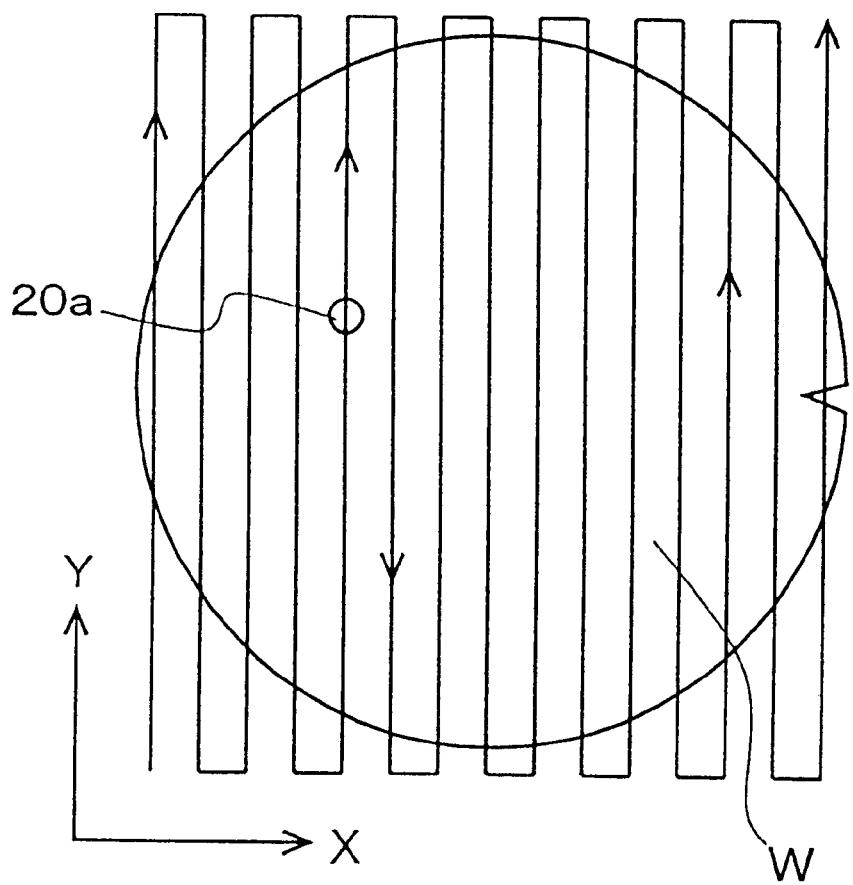
FIG. 4 is a plan view showing in what state a nozzle portion scans.
Figure 5:
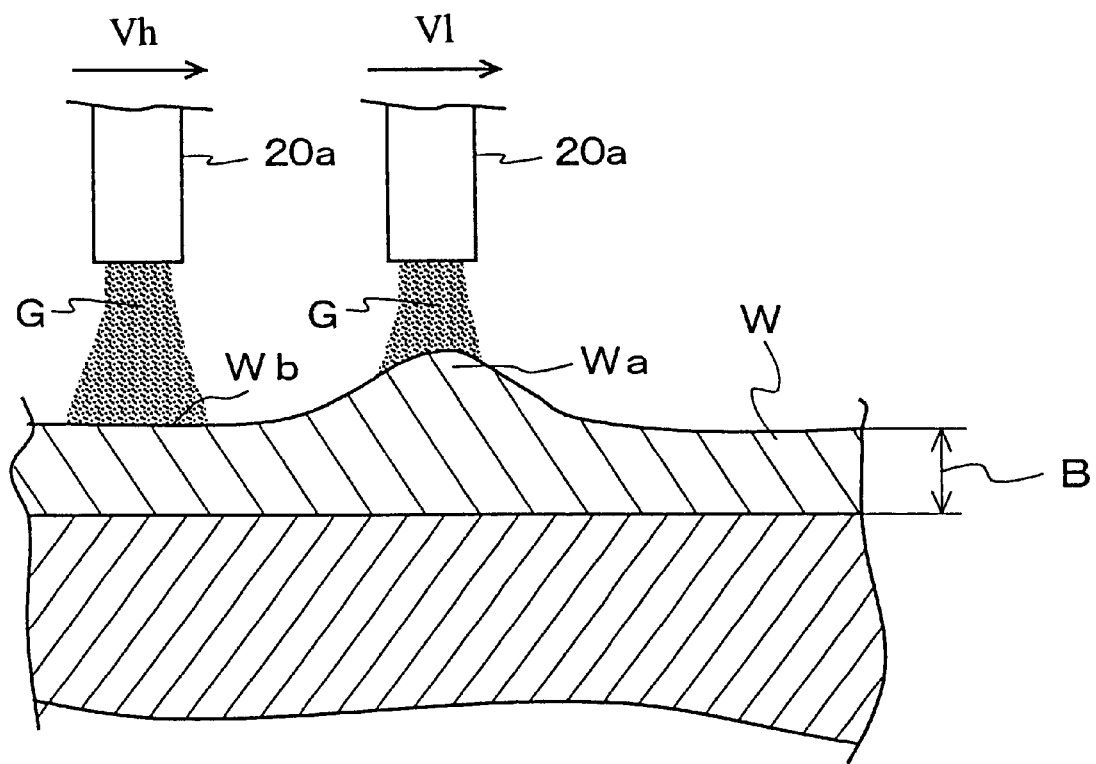
FIG. 5 is a sectional view showing in what state a deteriorated layer removing step is carried out.

More specifically, the X-Y drive mechanism 50 is operated by the control computer 49, causing the chuck 41 with the wafer W chucked thereon to move in a zigzag fashion in X-Y directions. As shown in FIG. 4, the nozzle 20a is allowed to scan in a zigzag fashion relatively and vertically with respect to the wafer W. A relative velocity of the nozzle portion 20a with respect to the wafer W is set beforehand so as to be approximately in inverse proportion to the thickness of a relatively thick portion Wa of the wafer. By so doing, as shown in FIG. 5, the nozzle portion 20a moves just above a non-relatively thick portion Wb at a high speed $V_h$, and when the nozzle portion 20a arrives at a position just above the relatively thick portion Wa, it moves at a speed $V_\lambda$ which is set in accordance with the thickness of the relatively thick portion Wa. This results in a longer etching time for the relatively thick portion Wa and the relatively thick portion being etched flatways. In this way local etching is performed successively throughout the entire surface of the wafer W, whereby a deteriorated layer B of a depth of about 10 to 15 μm from the wafer surface can be etched off and the wafer surface can be made flat.

Thus, according to the dry etching process 2 in the semiconductor wafer manufacturing method of this embodiment, there does not occur such a biasing phenomenon of the concentration and flow velocity of an etching solution as in the conventional acid etching process and therefore the deteriorated layer B can be removed-without impairing the flatness throughout the whole surface of the wafer W attained in the planarizing process 101. Besides, the dilution effect of the solution based on the formation of a reaction product in acid etching does not differ at various positions of the wafer, thus permitting both ensuring flatness and removal of the deteriorated layer even in the case of a large-sized wafer W having a diameter as large as 300 mm.

Moreover, since the wafer W is etched chemically using a neutral active species, there is attained a constant etching speed irrespective of the crystal orientation of silicon in the wafer. That is, since the wafer silicon is etched in an isotropic shape, there is no fear of etch pit being formed on the wafer surface.

Since the semiconductor wafer manufacturing method of this embodiment adopts the dry etching process 2 using gas, the storage of the gas is very easy and a waste gas treating equipment can be constructed at a low cost. Unlike the etching solution, the etching gas does not require any additional cost for making its purity high and for the maintenance and storage thereof.

Further, since the heating process 1 is adopted in the semiconductor wafer manufacturing method of this embodiment, the reaction rate between the neutral active species G and silicon of the wafer W can be increased by heating the wafer. As a result, it is possible to improve the etching grade.

Lastly, as shown in FIG. 1, the polishing process 103 is carried out after completion of the dry etching process 2 to complete the semiconductor wafer manufacturing method of this embodiment.

(Second Embodiment)

Figure 6:
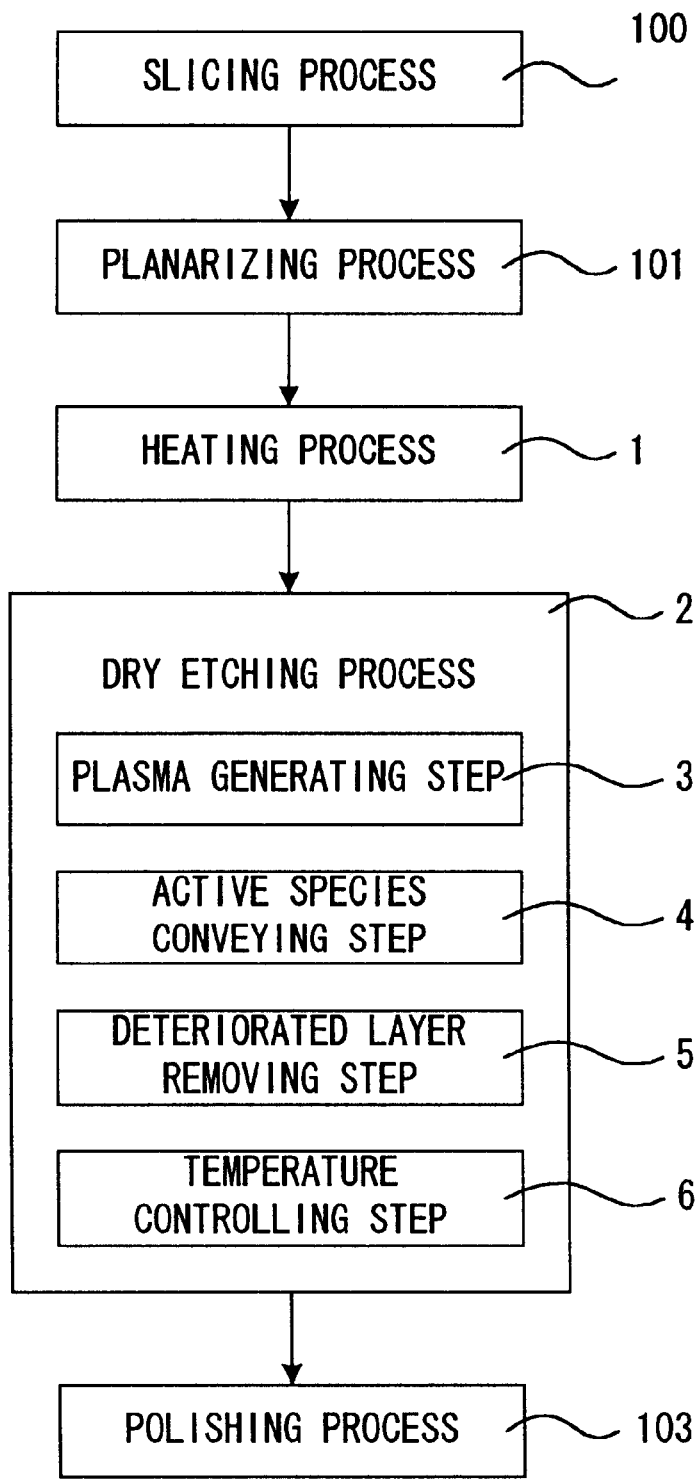
FIG. 6 is a block diagram showing a semiconductor wafer manufacturing method according to the second embodiment of the present invention.

FIG. 6 is a block diagram showing a semiconductor wafer manufacturing method according to the second embodiment of the present invention.

As shown in the same figure, this second embodiment is different from the previous first embodiment in that the heating process 1 adopted in the first embodiment is not adopted and instead there is adopted a temperature controlling step 6 in the dry etching process 2.

In the temperature controlling step 6 there is made control so that one side of the wafer W to which the neutral active species G is sprayed is heated to a temperature of above 60° C., while the side opposite to the one side is cooled to as not to exceed 350° C. In the heating process 1 adopted in the first embodiment the whole of the wafer W is heated to a temperature in the range from 60° to 350° C. and at the same time the dry etching process is carried out. Consequently, the temperature of the wafer W may rise up to a level exceeding 350° C. due to the reaction heat generated during etching. In the wafer W with wiring patterns formed thereon it is not desirable that the wiring pattern-formed side of the wafer be heated to such a high temperature. For this reason the temperature controlling step 6 is provided so that the wafer W can be subjected to dry etching in a satisfactory manner.

Figure 7:
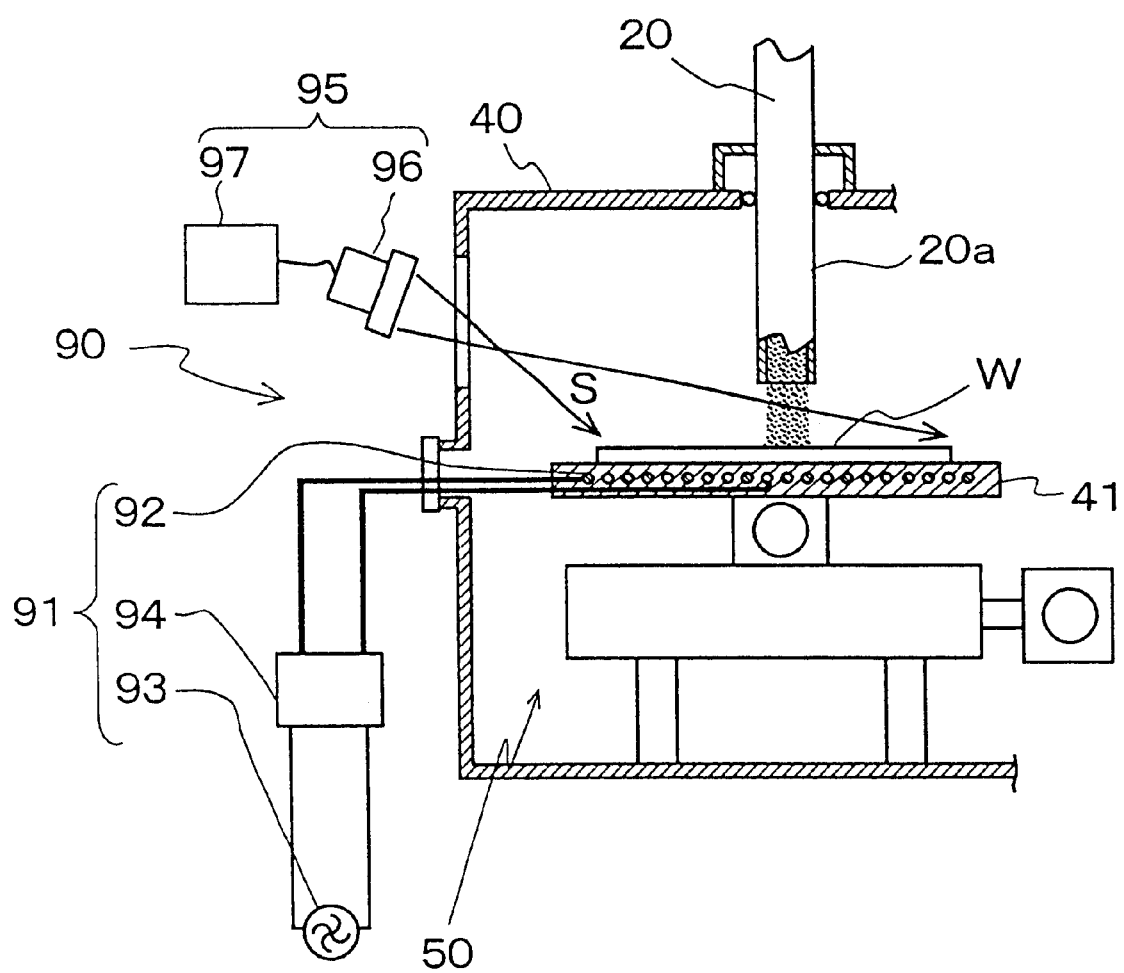
FIG. 7 is a partially cut-away sectional view showing a local etching system applied to the second embodiment.

FIG. 7 is a partially cut-away sectional view of a local etching system applied to the second embodiment.

Indicated at 90 is a temperature control system in which the temperature controlling step 6 can be carried out. The temperature control system 90 has a cooling unit 91 and a heating unit 95.

The cooling unit 91 is provided with a pipe 92, a pump 93 for supplying a refrigerant to the pipe 92, and a flow rate controller 94 for controlling the flow rate of the refrigerant fed from the pump 93 to the pipe 92. More specifically, the pipe 92 is received in the interior of the chuck 41 in a spirally bent shape along the whole of the back side of the wafer W. Both ends of the pipe 92 are drawn out from the chuck 41 and are connected to the flow rate controller 94, which in turn is connected to the pump 93.

On the other hand, the heating unit 95 has a halogen heater 96 and a power supply 97. Infrared ray S is radiated from a lamp (not shown) of the halogen heater 96 to the entire surface of the wafer W through a window of the chamber 40 to heat the surface side of the wafer uniformly.

Using the temperature control system 90, the temperature controlling step 6 is carried out in the following manner.

The wafer W is put on the chuck 41 in such a manner that its side with patterns formed thereon and not to be heated to above 350° C. faces the chuck 41, and then infrared ray S is radiated to the wafer surface from the halogen heater 96 in the heating unit 95 to heat the wafer W. When the wafer temperature approaches 350° C. due to the reaction heat resulting from the reaction between the neutral active species G and silicon of the wafer W, the pump 93 in the cooling unit 91 is operated to supply the refrigerant to the pipe 92. At the same time, the flow rate of the refrigerant is adjusted by the flow rate controller 94 and the temperature of the back of the wafer W is maintained at a level of below 350° C.

Other constructional points, as well as functions and effects, are the same as in the first embodiment and so descriptions thereof will here be omitted.

(Third Embodiment)

This third embodiment is different from the first embodiment in that both sides of the wafer W are etched at a time in the dry etching process 2.

Figure 8:
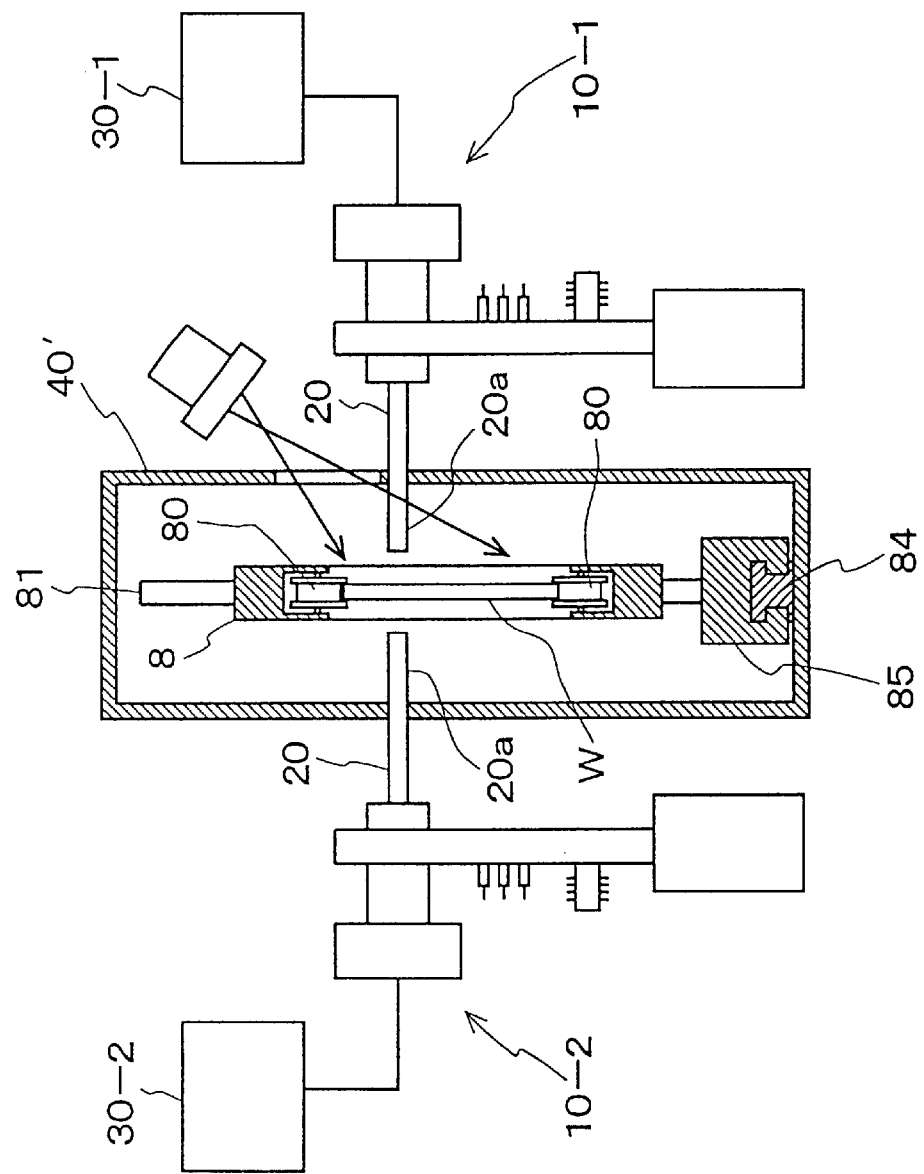
FIG. 8 is a sectional view showing a double-side local etching system for carrying out a dry etching process adopted in the third embodiment of the present invention.
Figure 9:
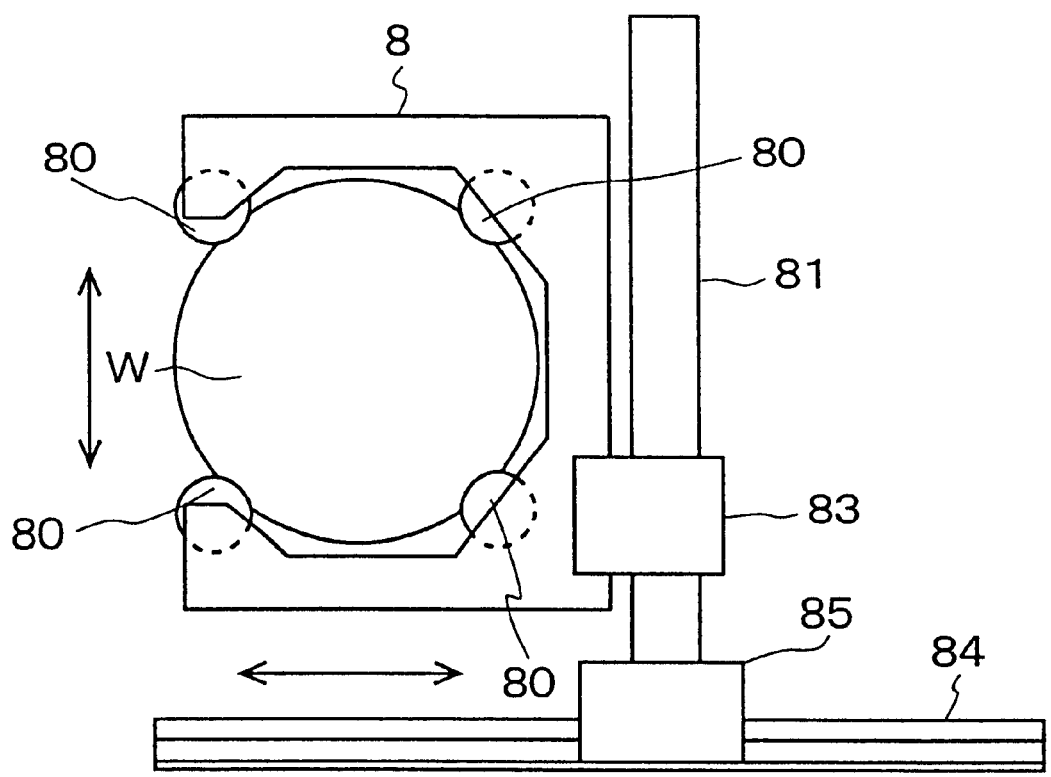
FIG. 9 is a side view showing means which carries out a deteriorated layer removing step by moving a nozzle portion relatively along a wafer.

FIG. 8 is a sectional view showing a double-side local etching system for carrying out the dry etching process 2 in this third embodiment and FIG. 9 is a side view showing means which carries out the deteriorated layer removing step 5 by moving nozzle portions 20a relatively along the wafer W.

As shown in FIG. 8, the double-side local etching system is provided with two plasma generators 10-1 and 10-2 on both sides of a chamber 40', with gas supply units 30-1 and 30-2 being connected to the plasma generators 10-1 and 10-2, respectively.

In the plasma generators 10-1 and 10-2, alumina discharge tubes 20 are inserted into the chamber 40' and nozzle portions 20a are disposed respectively in proximity to both sides of the wafer W.

The wafer W is held by a holder 8 provided within the chamber 40'. To be more specific, as shown in FIG. 9, an outer peripheral edge of the wafer W is supported by four clamps 80, and the holder 8 is held by a Z-axis slider 83 which is slidable along a Z-axis rail 81. The Z-axis rail 81 is erected on an X-axis slider 85 which is slidable along an X-axis rail 84.

In such a construction, the neutral active species G is jetted from the nozzle portions 20a of the plasma generators 10-1 and 10-2 while allowing the X-axis slider 85 to slide transversely along the X-axis rail 84 and allowing the Z-axis slider 83 to slide vertically along the Z-axis rail 81, to etch both sides of the wafer W at a time. Thus, both sides of the wafer W can be subjected simultaneously to the deteriorated layer removing step 5 to a complete extent.

Other constructional points, as well as functions and effects, are the same as in the previous first embodiment and so descriptions thereof will here be omitted.

Although preferred embodiments are specifically illustrated and described herein, it will be appreciated that many modifications and variations of the present invention are possible in light of the above teachings and within the purview of the appended claims without departing from the spirit and intended scope of the invention.

For example, although in the above embodiments hydrogen is used as an additive gas in the plasma generating step, oxygen gas or ammonia gas maybe used in place of hydrogen.

Although the heating step and the temperature controlling step are adopted in the above first and second embodiments, even semiconductor wafer manufacturing methods not involving such process and step are not excluded from the scope of the invention.

Although $SF_6$ gas was used as a halogen-containing compound gas, there also may be used $CF_4$ (carbon tetrafluoride) gas or $NF_3$ (nitrogen trifluoride) gas.

Although the alumina discharge tube 20 was used as a discharge tube, it goes without saying that even if the alumina discharge tube 20 is substituted by a quartz discharge tube or an aluminum nitride discharge tube, there can be obtained the same effect.

Figure 10:
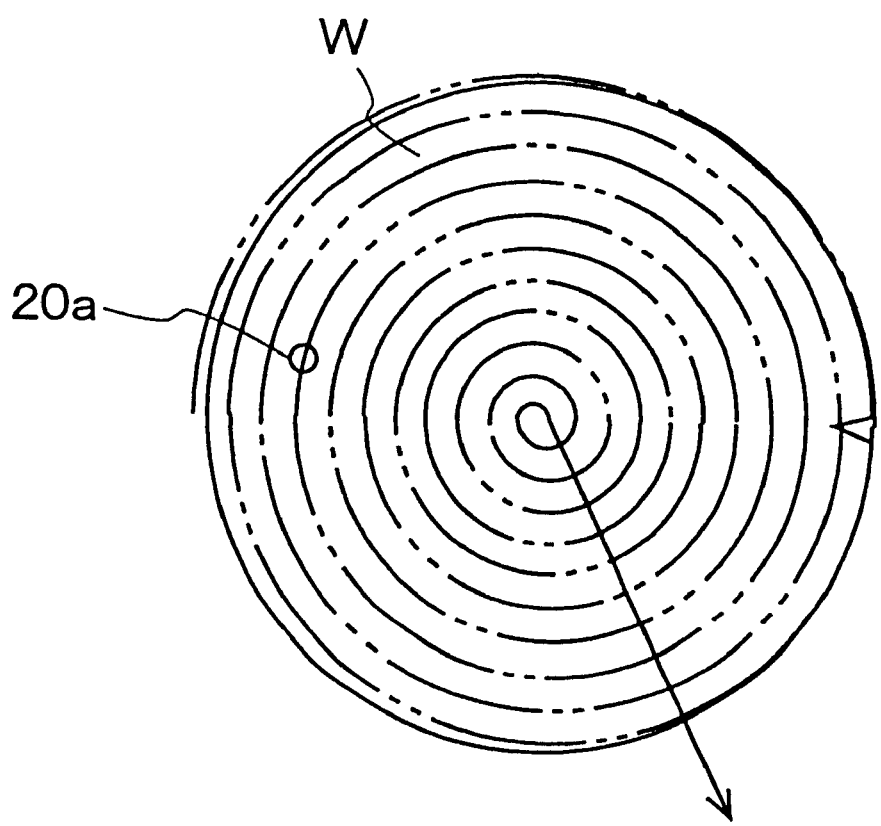
FIG. 10 is a plan view showing a modification of a nozzle scanning motion.

Although in the first embodiment the deteriorated layer removing step 5 is carried out by moving the nozzle portion 20a in one X direction while allowing the nozzle portion to reciprocate in Y direction, as shown in FIG. 4, the same step 5 may be carried out by reversing this movement, that is, by moving the nozzle portion 20a in one Y direction while allowing it to reciprocate in X direction. Further, as shown in FIG. 10, the deteriorated layer removing step 5 may be carried out by moving the nozzle portion 20a spirally along the surface of the wafer W.

Figure 11:
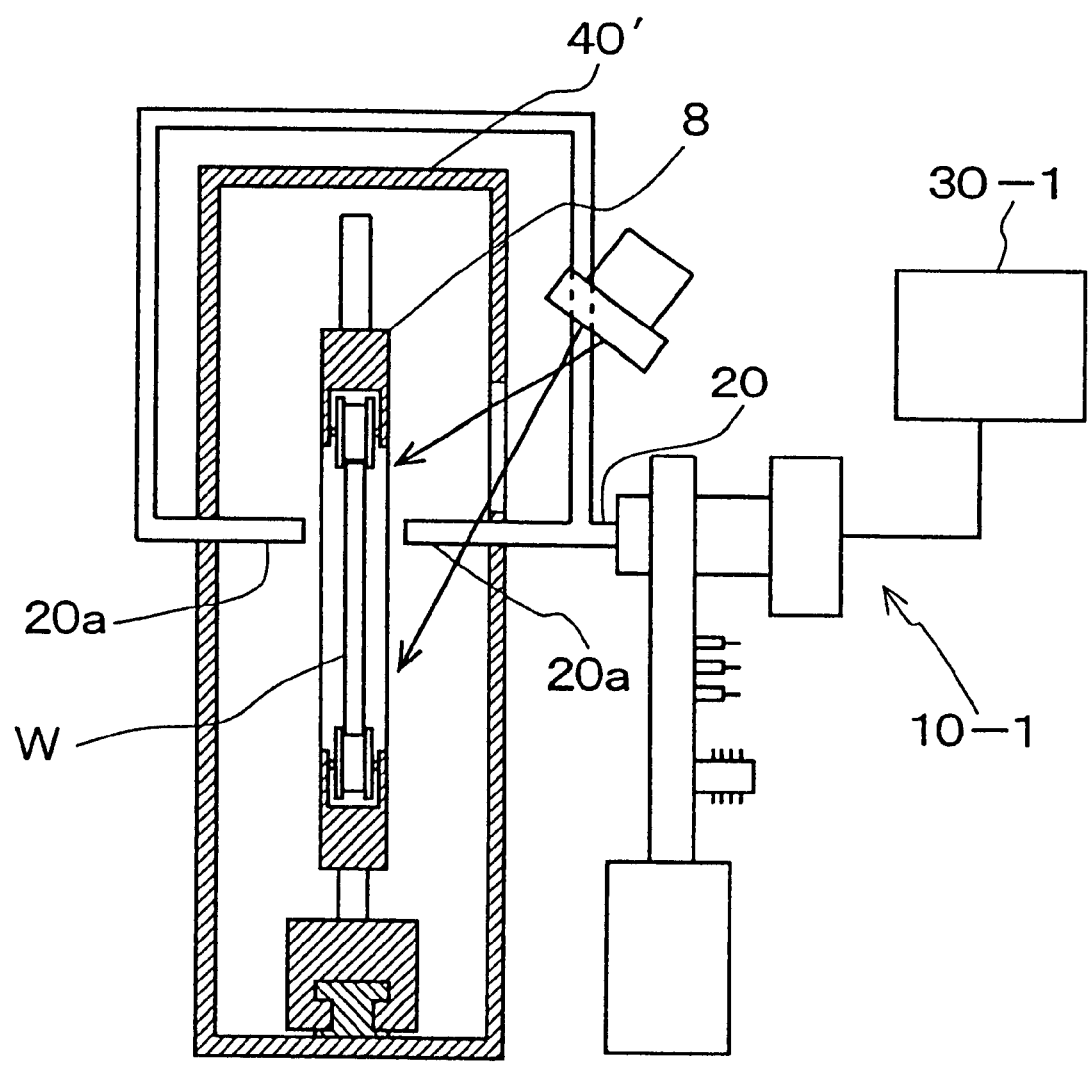
FIG. 11 is a sectional view showing a modification of the third embodiment.

Although in the above third embodiment two plasma generators 10-1 and 10-2 are disposed in opposition to each other, there may be adopted such a modification as shown in FIG. 11 in which only one plasma generator 10-1 is used, the nozzle portion 20a of its alumina discharge tube 20 is branched as another nozzle portion 20a, and both nozzle portions 20a are disposed respectively on both sides of the wafer W.

Although in the above embodiments the plasma generator 10 which generates a microwave and produces plasma is used as means for carrying out the plasma generating step, there may be used any of various other plasma generators, including a plasma generator which generates plasma by a high frequency to form a neutral active species, insofar as the means adopted can produce a neutral active species.

What is claimed is:

1. A method for manufacturing a semiconductor wafer, comprising:

a slicing process for slicing an ingot of a single silicon crystal to afford a semiconductor wafer for semiconductors;

a planarizing process for lapping or polishing a surface of said wafer obtained in the slicing process to flatten the wafer surface;

a dry etching process for removing a deteriorated layer from said wafer by spraying a neutral active species gas locally to the surface of said wafer obtained in said planarizing process, wherein the dry etching process comprises:

a plasma generating step for allowing a halogen-containing compound gas in a discharge tube to generate plasma gas containing a neutral active species;

an active species conveying step for separating said neutral active species from said plasma gas by conveying said plasma gas to an orifice side of a nozzle portion of said discharge tube, and spraying the neutral active species locally to the wafer surface opposed to nozzle orifice; and a deteriorated layer removing step by moving said nozzle portion relatively along said wafer surface to etch off said deteriorated layer from said wafer.

2. The method of claim 1, wherein at least one of oxygen gas, hydrogen gas, and ammonia gas is used as an additive gas in said plasma generating step in said dry etching process.

3. The method of claim 1, wherein a heating process for heating said wafer having gone through the planarizing process to a temperature of above 60° C. and below 350° C. is provided between said planarizing process and said dry etching process.

4. The method of claim 1, wherein said dry etching process further includes a temperature controlling step for making control so as to heat one side of said wafer to which said neutral active species is sprayed to a temperature of above 60° C. and to cool another side of said wafer to a temperature not exceeding 350° C.

5. The method of claim 1, further including a polishing process for mirror-polishing said wafer surface which has been treated in the dry etching process.

* * * * *